United States Patent
Moehlmann et al.

(10) Patent No.: US 11,658,666 B1
(45) Date of Patent: May 23, 2023

(54) FRACTIONAL-N ADPLL WITH REFERENCE DITHERING

(71) Applicant: NXP B.V., Eindhoven (NL)

(72) Inventors: Ulrich Moehlmann, Moisburg (DE); Kai Hendrik Misselwitz, Hanburg (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/708,681

(22) Filed: Mar. 30, 2022

(51) Int. Cl.
*H03L 7/099* (2006.01)
*H03L 7/081* (2006.01)
*H03L 7/093* (2006.01)
*H03L 7/083* (2006.01)

(52) U.S. Cl.
CPC ........... *H03L 7/0818* (2013.01); *H03L 7/083* (2013.01); *H03L 7/093* (2013.01); *H03L 7/0991* (2013.01); *H03L 2207/50* (2013.01)

(58) Field of Classification Search
CPC ..... H03L 7/081; H03L 7/0991; H03L 7/0992; H03L 7/104; H03L 7/18; H03L 2207/50
See application file for complete search history.

(56) References Cited

U.S. PATENT DOCUMENTS

| | | | | |
|---|---|---|---|---|
| 7,940,099 B2* | 5/2011 | Weltin-Wu | ........... | H03L 7/0991 327/155 |
| 8,830,001 B2* | 9/2014 | Zhuang | ..................... | H03C 5/00 331/34 |
| 2005/0186920 A1 | 8/2005 | Staszewski et al. | | |
| 2008/0068236 A1 | 3/2008 | Sheba et al. | | |
| 2009/0262877 A1 | 10/2009 | Shi et al. | | |
| 2012/0244824 A1 | 9/2012 | Entezari et al. | | |

OTHER PUBLICATIONS

He, Yuming et al., "24.7 A 673μW 1.8-to-2.5GHz Dividerless Fractional-N Digital PLL with an Inherent Frequency-Capture Capability and a Phase-Dithering Spur Mitigation for IoT Applications," 2017 IEEE International Solid-State Circuits Conference (ISSCC), San Francisco, CA, 2017, pp. 420-421, doi: 10.1109/ISSCC.2017. 7870440.

NXP Semiconductor, "NXP Digital Single-Tuner TEF664x: High-end, DSP-based AM/FM Single Tuner with Support for Digital Radio," TEF664x Brochure Datasheet by NXP USA Inc.; document No. 9397 750 17318; Aug. 2012; 3 pages.

NXP Semiconductor, "SAF775x: Multi-tuner Car Radio and Audio One-Chip," Preliminary Datasheet Rev. 1.43; Dec. 14, 2012, 71 pages.

Temporiti, E. et al., "A 3.5 GHz Wideband ADPLL With Fractional Spur Suppression Through TDC Dithering and Feedforward Compensation," IEEE Journal of Solid-State Circuits, vol. 45, No. 12, pp. 2723-2736, Dec. 2010, doi: 10.1109/JSSC.2010.2077370.

(Continued)

*Primary Examiner* — Patrick O Neill

(57) ABSTRACT

A fractional-N all digital phase locked loop (ADPLL) includes a randomly modulated delay having a triangular distribution to a frequency reference at an input of the fractional-n ADPLL to reduce spurious tones introduced by delta-sigma modulation of a frequency control word without requiring active control or calibration. In some embodiments, a delay line generates the randomly modulated delay based on a uniformly distributed random number with a flat spectrum that is shaped by a high pass filter.

20 Claims, 10 Drawing Sheets

(56) References Cited

OTHER PUBLICATIONS

Waheed, K. et al., "Spurious-Free Time-to-Digital Conversion in an ADPLL Using Short Dithering Sequences," IEEE Transactions on Circuits and Systems I: Regular Papers, vol. 58, No. 9, pp. 2051-2060, Sep. 2011, doi: 10.1109/TCSI.2011.2163981.

Wannamaker, R. et al., "A Theory of Nonsubtractive Dither," IEEE Transactions on Signal Processing, vol. 48, No. 2, pp. 499-516, Feb. 2000, doi: 10.1109/78.823976.

Electronic Specifier, "NXP—First All-in-One Digital One-Chip for Automotive Radio Digital," TEF663x Digital On-Chip Receiver; Dec. 15, 2010; 1 page.

\* cited by examiner

FRACTIONAL-N ADPLL WITH REFERENCE DITHERING

BACKGROUND

A phase locked loop (PLL) generates an output signal with a defined phase relationship to an input reference signal. The output signal is matched to the phase of the input reference signal by a feedback loop in which the phase difference between the input reference signal and the output signal is determined by a phase detector. In a digital phase locked loop, the phase detector outputs a digital signal. The output from the phase detector (indicating phase error) is received by a loop filter. The loop filter in turn provides an output signal to a frequency-controlled oscillator. In an all-digital phase locked loop (ADPLL), the phase detector outputs a digital signal, the loop filter is a digital loop filter, and the frequency-controlled oscillator is a digitally controlled oscillator.

An integer ADPLL includes a reference phase generator configured to integrate an input frequency control word (FCW), a phase detector, a loop filter, a digitally controlled oscillator (DCO), and a feedback path including a counter and a time-to-digital converter (TDC). The FCW of an integer ADPLL is a constant integer value that describes the ratio between the DCO frequency and a reference frequency. The DCO frequency can only be an integer multiple of the reference frequency in an integer ADPLL.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

Figure 1:
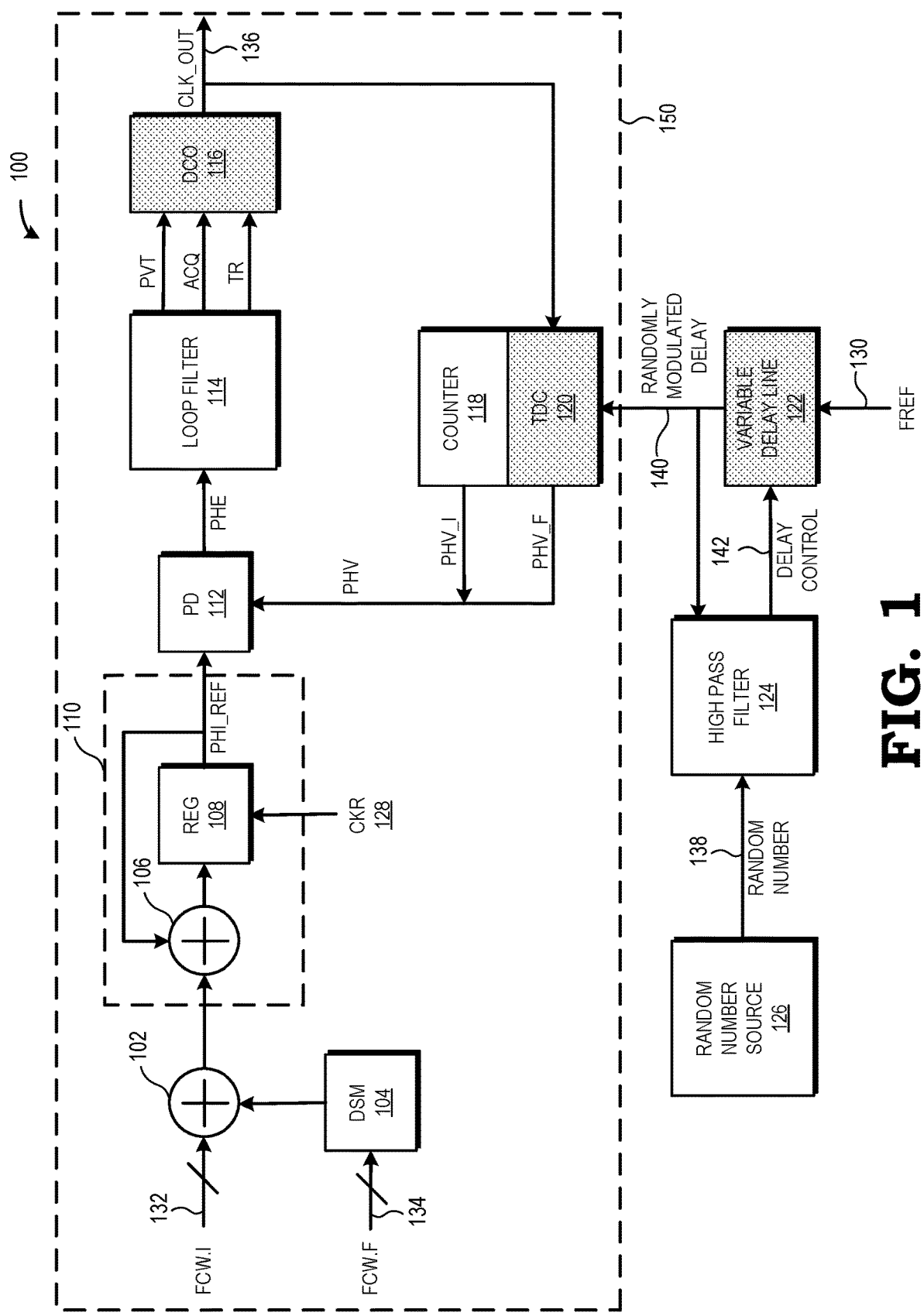
FIG. 1 is a block diagram of a system including a fractional-N ADPLL with single delay line reference dithering in accordance with some embodiments.

By dithering the FCW, an integer ADPLL can function as a fractional-N ADPLL. For example, addition of a delta-sigma modulator can produce a fractional-N frequency resolution in the parts per million (ppm) range. However, dithering the FCW with a delta-sigma modulator generates an offset to an integer frequency which causes the phase to move over the entire phase range. By moving over the phase range, quantization effects cause a regular pattern that leads to spurious tones (also referred to as spurs) in the feedback path. Furthermore, the shaped noise with contributions mainly at high frequencies generated by the delta-sigma modulator can negatively impact the ADPLL performance. Phase locked loops are often required to achieve a specific noise performance and the maximum allowable phase noise may be determined by an intended application for a phase locked loop. Depending on the application of the phase locked loop, spurious tones can lead to serious performance degradation of an entire system. For example, if the phase locked loop is used as a local oscillator in a transceiver, spurious tones lead to unwanted mixing of side channels and result in a reduced signal to noise ratio. If the phase locked loop is used as a clock source of a digital circuit, spurious tones lead to additional clock uncertainty and can cause timing violations. If the phase locked loop is used in high-speed interfaces, spurious tones degrade the jitter performance and can lead to an increased bit error rate. Fractional-N ADPLLs and fractional-N PLLs in general are particularly prone to exhibiting spurs in their output spectrum when the ratio of output to input frequency is close to an integer value, severely limiting their application in such cases.

FIGS. 1-9 illustrate techniques for reducing spurious tones introduced by delta sigma modulation of the FCW to implement a fractional-N ADPLL. By adding a randomly modulated delay having a triangular distribution to a frequency reference at an input of the fractional-n ADPLL, spurious tones are reduced for multiple TDC resolutions without requiring active control or calibration. In some embodiments, the randomly modulated delay is added via a delay line. The delay line is analog in some embodiments and digital in other embodiments and is controlled by a digital signal. The range of the randomly modulated delay spans at least q to −q, where q is the quantization step (sometimes referred to as the "quantization step size") of the TDC.

In some embodiments, the delay line generates the randomly modulated delay based on a uniformly distributed random number with a flat spectrum that is shaped by a high pass filter. The high pass filtering is performed by a first order high pass filter that differentiates the uniformly distributed random number in some embodiments. After differentiation, the random number follows a triangular distribution which still covers the range of at least spans at least q to −q, where q is the quantization step of the TDC. Due to high-pass filtering, low frequency components of the noise added by the delay line are rejected. In addition, the PLL acts as a low-pass filter that rejects most of the high-pass shaped dither signal added by the delay line. As a result, the dither signal does not add significant noise to the PLL's output spectrum.

In some embodiments in which the delay line is implemented in an analog manner, the delay line includes a number of unit delay cells and a delay line controller varies either the delay of each unit delay cell or the number of unit delay cells that the dither signal traverses. In some embodiments in which the delay line implements digital control, the delay line includes dynamic element matching to increase linearity. To facilitate both expanded range and resolution of the randomly modulated delay, in some embodiments the delay line is split into a fine delay line and a coarse delay line with differing unit delays.

FIG. 1 illustrates a system 100 including an example fractional-N ADPLL 150 with single delay line reference dithering in accordance with some embodiments. The fractional-N ADPLL 150 receives a system clock signal CKR 128. Based on the system clock signal CKR 128, the system 100 produces an output signal CLK_OUT 136. The output signal CLK_OUT 136 includes an output frequency labeled and an output phase. Upon receiving a new system clock signal CKR 128 having one or more of a new frequency reference and a new phase reference, the fractional-N ADPLL 150 first tunes to, and locks to, a new output signal CLK_OUT 136 having a new output frequency and a new output phase. The system 100 includes a fractional-N ADPLL 150 and a variable delay line 122, a high pass filter 124, and a random number source 126. The fractional-N ADPLL 150 includes a reference phase generator 110, a phase detector 112, a loop filter 114, a digitally controlled oscillator (DCO) 116, a counter 118, and a time-to-digital converter (TDC) 120. Components in the fractional-N ADPLL 150 that are analog are illustrated with shading. Other components in the fractional-N ADPLL 150 are digital and are illustrated without shading.

The reference phase generator 110 includes an adder 106 and a register 108 arranged to integrate an input integer frequency control word signal having FCW.i 132 and FCW.f 134 which are dithered by a delta-sigma modulator 104 with a fractional frequency control word signal. Both are added at 102. The system clock signal CKR 128 is derived from a reference signal FREF 130 by sampling the reference signal FREF 130 with the DCO 116 clock, and provides an output signal with a stable frequency that is used to clock the register 108 of the reference phase generator 110. The reference phase generator 110 is configured to convert the FCW.i 132 and FCW.f 134 from the frequency domain to the phase domain and provide a reference phase ramp PHI_REF The phase detector 112 compares the reference phase ramp PHI_REF with a feedback ramp PHV derived from the output of the DCO 116, and outputs a phase error signal PHE. The feedback ramp PHV is determined by combining (e.g., by fixed point concatenation) the output from the counter 118 and the TDC 120.

The loop filter 114 is controlled by an ADPLL control block (not shown) and receives the phase error signal PHE and performs a filtering operation. The loop filter 114 provides three output signals for controlling the DCO 116: a process voltage temperature control signal PVT, an acquisition control signal ACQ, and a tracking signal TR. Each of these control signals controls a switched capacitor bank of the DCO 116 to vary the output frequency of the DCO 116, which is an integer multiple of the reference frequency FREF 130 when the fractional-N ADPLL 150 is operated in integer mode and the loop is settled. Other frequency control mechanisms, such as digital to analog converters with varactors, or a current-controller oscillator controlled by a current digital-to-analog converter (DAC), are used in alternative arrangements.

The output from the DCO 116 is received as an input signal at the TDC 120. The TDC 120 measures and quantizes the timing difference between transitions of the output signal from the system clock signal CKR 128 and the transitions in the output from the DCO 116. The TDC 120 produces a TDC output labeled PHV_F. The counter 118 accumulates a count of the transitions in the output from the DCO 116 and produces an output labeled as PHV_I. The combination of the signals from the TDC 120 and the counter 118 results in an input PHV to the phase detector 112. The phase detector 112 sums a signal from the reference phase generator 110 and a negative value of a phase based on the TDC 120 output PHV_F and the counter 118 output PHV_I to produce a phase difference signal labeled PHE which serves as an input to the loop filter 114.

To facilitate the reduction of spurious tones that can be caused by regular quantization patterns in the feedback path from dithering of the fractional frequency control word FCW.f 134 by the delta-sigma modulator 104 and adding it to the integer frequency control word FCW_i 132, the system 100 introduces a randomly modulated delay 140 (also referred to as a dithering signal) with controlled properties to dither the phase of the reference frequency 130 at the input to the fractional-N ADPLL 150. For example, if the reference frequency FREF 130 is 40 megahertz and the ratio of the output frequency CLK_OUT 136 to the input frequency is 60.0001, an offset of 4 kilohertz will appear as a spur in the output frequency CLK-OUT 136 signal and additional spurs will occur at multiples of the calculated offset frequency. To reduce such spurs, the system 100 dithers the phase error by adding noise in the form of a randomly modulated delay 140 (also referred to as a dithering signal) to the feedback signal (also referred to as a frequency reference or reference clock signal) of the fractional-N ADPLL 150. The randomly modulated delay 140 is added via a variable delay line 122 that receives a uniformly distributed random number 138 generated by a random number source 126 such as a linear feedback shift register (LFSR) that is shaped by a high pass filter 124. In some embodiments, the variable delay line 122 is implemented in the analog domain and in other embodiments the variable delay line 122 is implemented in the digital domain.

After filtering by the high pass filter 124, the random number has a triangular distribution and is used as a delay control 142 for the variable delay line 122. The amplitude of the randomly modulated delay 140 is large enough to cover more than the least significant bits (LSB) of the feedback path. In some embodiments, the dither range is selected to be larger because spur suppression is relatively insensitive to large dither ranges and smaller dither ranges lead to less effective spur suppression. In some embodiments, the variable delay line 122 is divided into a coarse resolution portion (not shown) and a fine resolution portion (not shown) to enable a high dithering signal amplitude with high timing resolution. In addition, in some embodiments the dithering signal 140 is noise shaped to prevent impact to inband phase noise of the fractional-N ADPLL 150.

Figure 2:
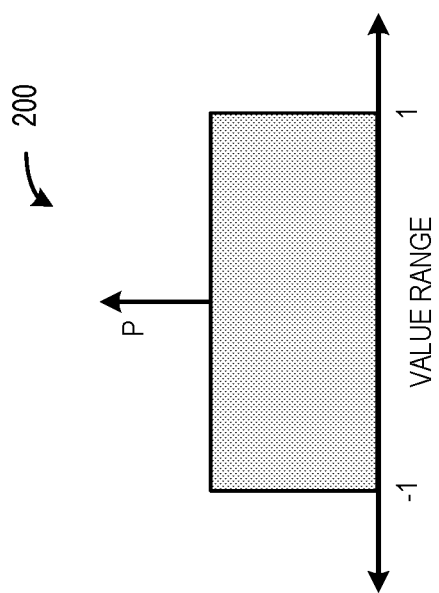
FIG. 2 is a graph of a probability distribution of a uniformly distributed random number in accordance with some embodiments.

FIG. 2 is a graph 200 of a probability distribution of a uniformly distributed random number generated by the random number source 126 in accordance with some embodiments. The value range of the uniformly distributed random number is normalized to have a value range from −1 to 1. Because the random number is uniformly distributed, the probability P of the random number having any value within the range of −1 to 1 is the same, giving the probability distribution a flat shape or spectrum.

Figure 3:
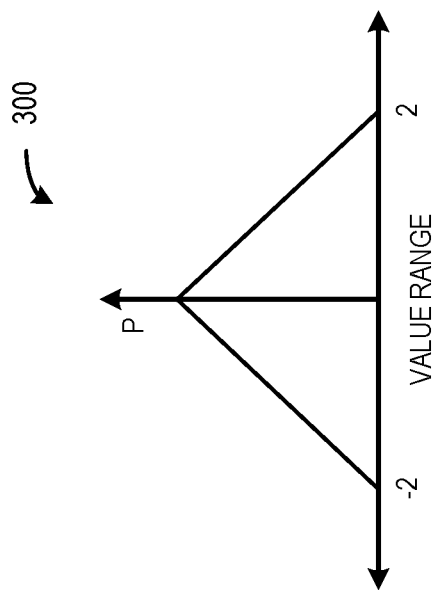
FIG. 3 is a graph of a probability distribution of a uniformly distributed random number after high pass filtering with a first order high pass filter in accordance with some embodiments.

FIG. 3 is a graph 300 of a probability distribution of the uniformly distributed random number after high pass filtering with a first order high pass filter such as high pass filter 124 in accordance with some embodiments. The high pass filter 124 differentiates the uniformly distributed random number such that the graph 300 of the probability distribution of the differences between the normalized values of the uniformly distributed random number follows a triangular distribution. The range of the triangular distribution covers at least spans at least q to −q, where q is the quantization step of the TDC 120. In the illustrated example, the minimum and maximum differences between normalized values of the uniformly distributed random number range from −2 to 2. The probability P of the difference between normalized values of the uniformly distributed random number being zero is high, whereas the probability P of the differences between normalized values of the uniformly distributed random number having a value within the range of −2 to 2 diminishes linearly as the differences approach the extents of the range.

Due to high pass filtering by the high pass filter 124, low frequency components of the noise are rejected. Further, because the phase locked loop acts as a low-pass filter, most of the high-pass shaped dither signal is rejected such that the dither signal does not add significant noise to the output spectrum of the fractional-N ADPLL 150. The order of the low pass loop filter 114 is selected such that the noise introduced by the delta-sigma modulator 104 is cancelled and contributes only −20 dB/decade to the overall noise characteristics of the fractional-N ADPLL 150. In some embodiments, the delta-sigma modulator 104 is implemented as a multi-stage noise shaping (MASH 1-1-1) structure with a noise shaping characteristic of +60 dB/decade and the loop filter 114 is implemented as at least a third order filter. In other embodiments, other implementations of the delta-sigma modulator 104 are used, and characteristics of the loop filter 114 are selected to reject delta-sigma quantization noise from the output.

Figure 4:
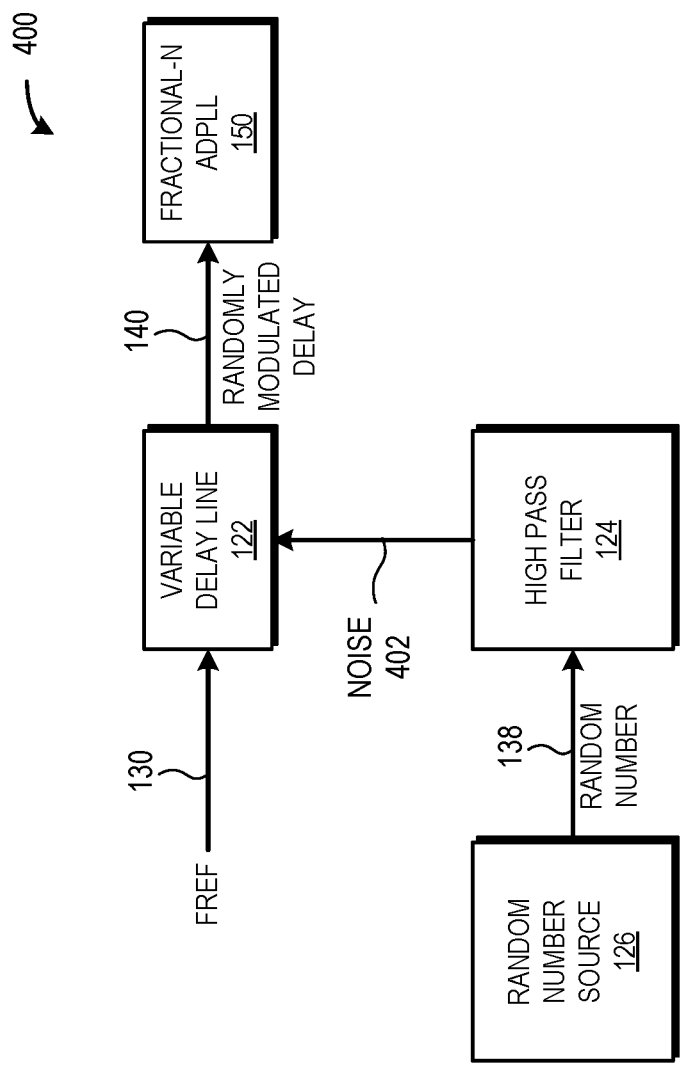
FIG. 4 is a block diagram of a system including a fractional-N ADPLL having a frequency reference dithered by a variable delay line in accordance with some embodiments.

FIG. 4 is a block diagram 400 of the fractional-N ADPLL 150 having the reference frequency 130 dithered by the variable delay line 122 in accordance with some embodiments. The random number 138 generated by the random number source 126 is filtered by the high pass filter 124 to produce noise 402 having a triangular distribution. The noise 402 is added to the reference frequency 130 at the variable delay line 122 to produce the randomly modulated delay 140 that is input to the fractional-N ADPLL 150. The resulting randomly modulated delay 140 produces a triangularly distributed and noise shaped non-subtractive reference dither that reduces fractional-N spurs in the fractional-N ADPLL 150 without adversely affecting the overall phase noise. The randomly modulated delay 140 in conjunction with the higher order loop filter 114 cancels the delta-sigma quantization noise without requiring active control or calibration.

Figure 5:
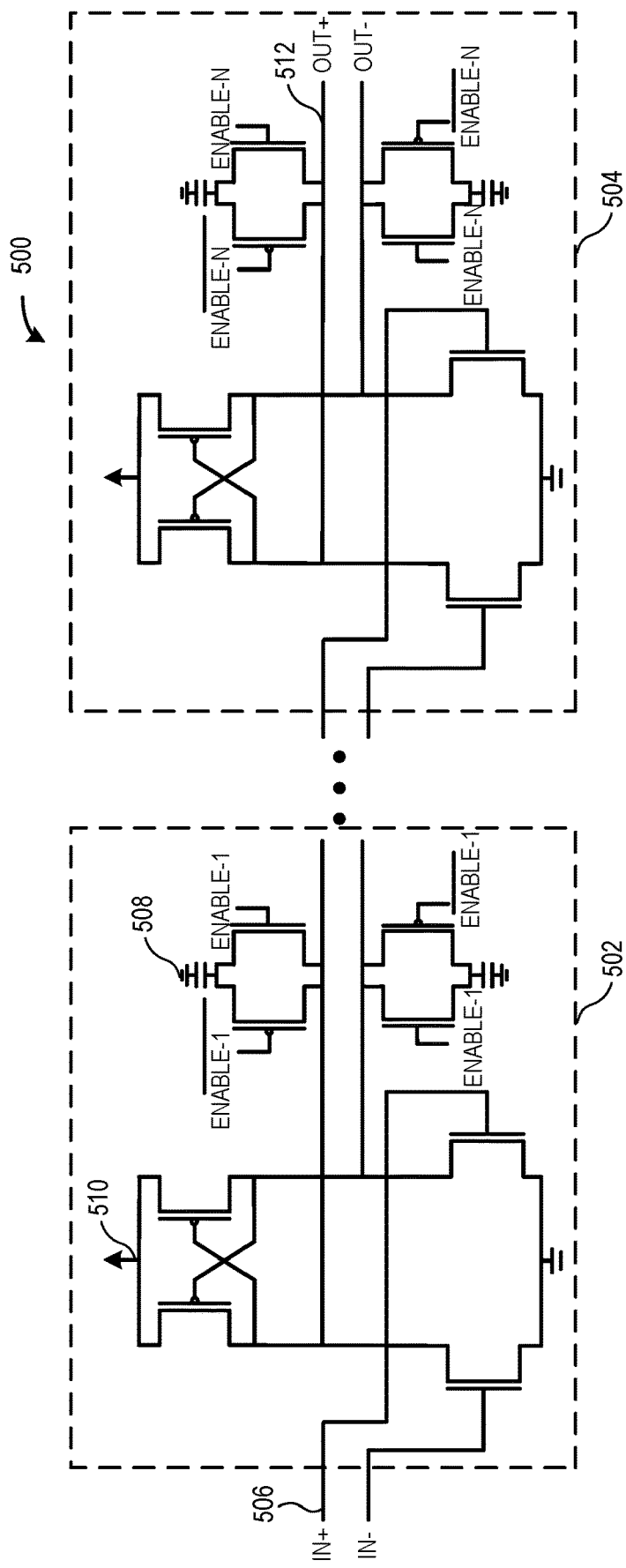
FIG. 5 is a diagram of a variable delay line in accordance with some embodiments.

FIG. 5 is a diagram of a variable delay line 500 in accordance with some embodiments. In some embodiments in which the variable delay line 500 is implemented in an analog manner, the variable delay line includes a plurality of unit delay cells 502, 504. In other embodiments, the analog variable delay line 500 is implemented using non-unit weighted delays (not shown). The variable delay line 500 varies either the delay of each unit delay cell 502, 504, or the number of cells that a signal that is to be delayed traverses. In some embodiments, the variable delay line 500 varies the delay of a logic gate by limiting the supply current 510 and increasing the load capacitance 508 at the output of the unit delay cell 502, 504. Varying the delay of the logic gate is achieved in either the analog domain or the digital domain. For example, to increase the load, a varactor can be used for analog control, while switched capacitances can be used to provide digital control. As another example, varying the supply current is performed in some embodiments via voltage-controlled current sources to provide analog control, while switching the amount of fixed current source provides digital control. In the illustrated example, latches are used as non-inverting buffers, the delays of which are modulated by switching capacitive loads using CMOS transmission gates.

Figure 6:
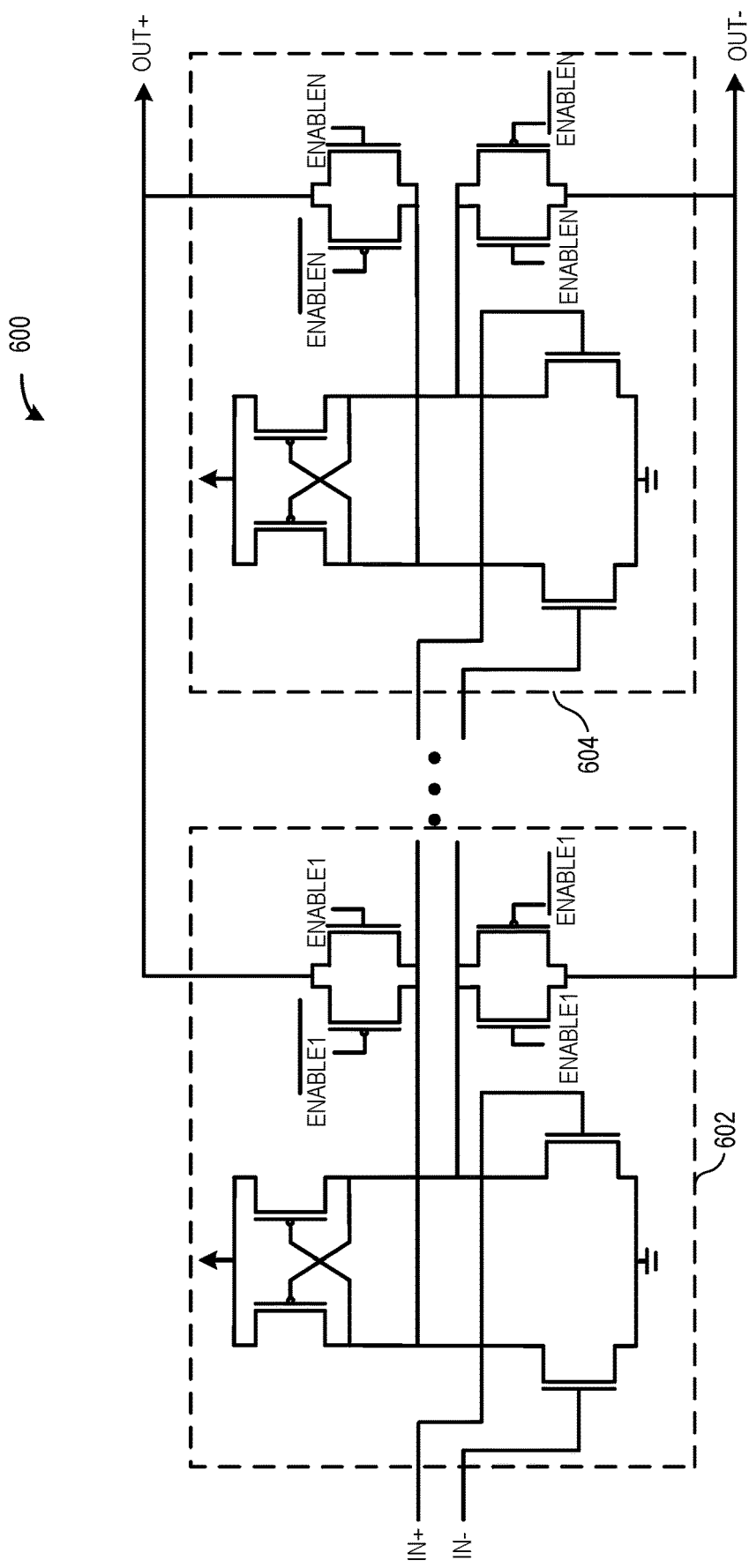
FIG. 6 is a diagram of a delay line with constant delays in accordance with some embodiments.

FIG. 6 is a diagram of a delay line 600 with unit delay cells 602, 604 applying constant delays in accordance with some embodiments. In the illustrated example, the delays of the unit delay cells 602, 604 are not varied. Instead, the number of elements the reference traverses is varied by tapping the delay line at different points.

Figure 7:
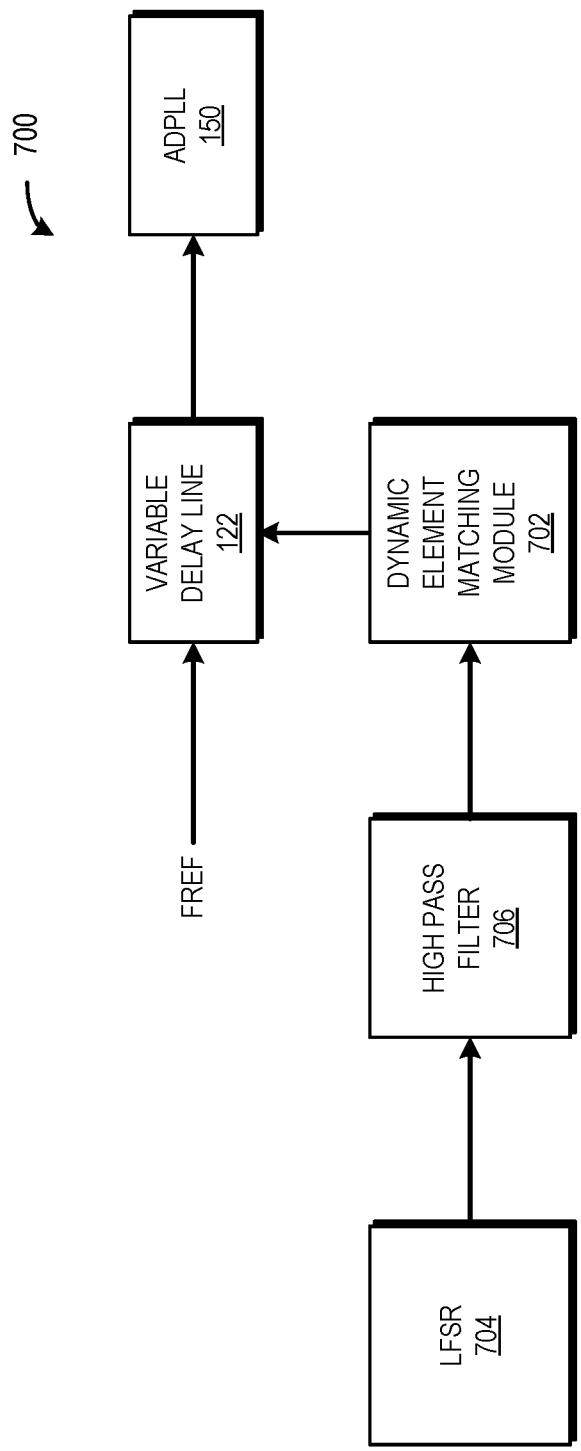
FIG. 7 is a block diagram of a fractional-N ADPLL having a frequency reference dithered by a delay line with digital control and a dynamic matching element in accordance with some embodiments.

FIG. 7 is a block diagram of a system 700 including the fractional-N ADPLL 150 having a frequency reference dithered by the variable delay line 122 with digital control and a dynamic element matching module 702 in accordance with some embodiments. To generate the control signal for the variable delay line 122 with analog control, in some embodiments thermal noise serves as a uniform random source and the triangularly distributed random signal, such as noise 402 in FIG. 4, is generated by high-pass filtering the output from the uniform random source.

To generate a digital control signal, in some embodiments the system 700 includes a linear-feedback shift register (LFSR) 704 as a uniform pseudo-random source and a simple finite impulse response high-pass filter 706 with a z-domain transfer function $1-z^{-1}$ to generate the triangularly distributed random signal. The LFSR 704 produces a statistically even predictable stream of bits having approximately the same number of zeros as ones on average. In the illustrated example, the system 700 includes the dynamic element matching module 702 to increase linearity when using a digitally controlled variable delay line 122. In some embodiments, the dynamic element matching module 702 includes one or more dynamic element matching circuits. Mismatches among nominally identical circuit elements cause non-linear distortion that appears as spurs caused by the delay line. The spurs become visible in the output clock and can therefore be measured in the phase error signal. By randomizing the mismatches, the dynamic element matching module 702 causes the error resulting from the mismatches to be pseudo-random noise that eliminates the spurs from the delay line.

In some embodiments that implement the variable delay line 122 with digital control, the system 700 monitors the timing relationship between the control signal and the reference propagating through the variable delay line 122. The system 700 ensures that the control signals do not change while a reference clock edge propagates through the variable delay line 122. In some embodiments, the system 700 clocks the control signal generation circuitry with the output of the variable delay line 122.

Figure 8:
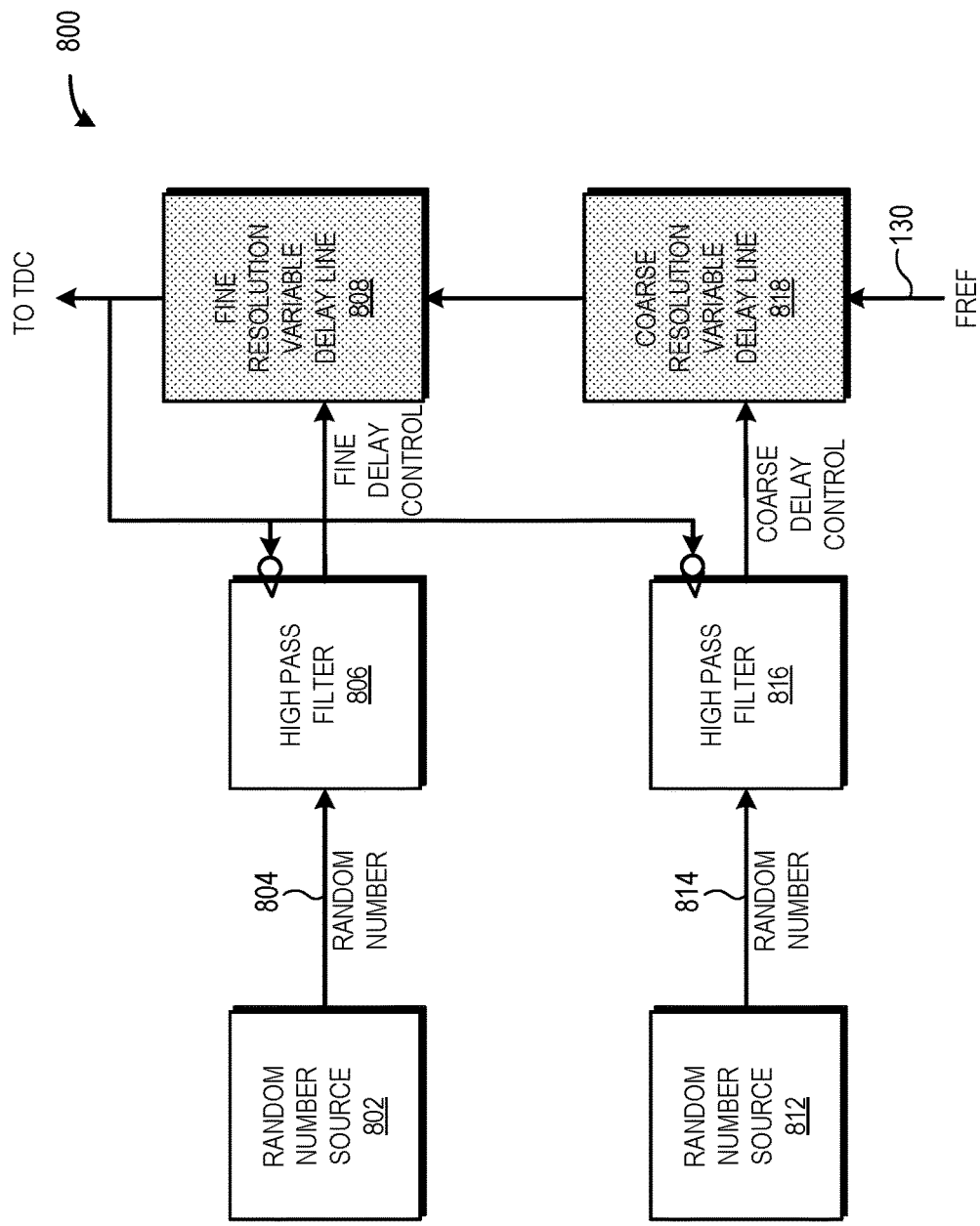
FIG. 8 is a block diagram of a delay line divided into a coarse resolution delay line and a fine resolution delay line in accordance with some embodiments.

FIG. 8 is a block diagram of a delay line 800 divided into a coarse resolution variable delay line 818 and a fine resolution variable delay line 808 in accordance with some embodiments. Splitting the delay line 800 into the coarse resolution variable delay line 818 and the fine resolution variable delay line 808 enables a large dithering amplitude with high timing resolution. The coarse resolution variable delay line 818 receives a random number 814 generated by a random number source 812 that is filtered by a high pass filter 816, while the fine resolution variable delay line 808 receives a random number 804 generated by a random number source 802 that is filtered by a high pass filter 806. In the illustrated example, the fine resolution variable delay line 808 is controlled independently of the coarse resolution variable delay line 818. In some embodiments, the fine resolution variable delay line 808 introduces a variable delay on the order of 100 femtoseconds, while the coarse resolution variable delay line 818 introduces a variable delay on the order of 10 picoseconds. Whereas a single variable delay line such as that illustrated in FIG. 1 includes on the order of 1000 stages in some embodiments, a divided variable delay line such as that illustrated in FIG. 8 includes on the order of 20 stages for each of the coarse resolution variable delay line 818 and the fine resolution variable delay line 808 in some embodiments while achieving similar suppression of tones in the quantization noise.

Figure 9:
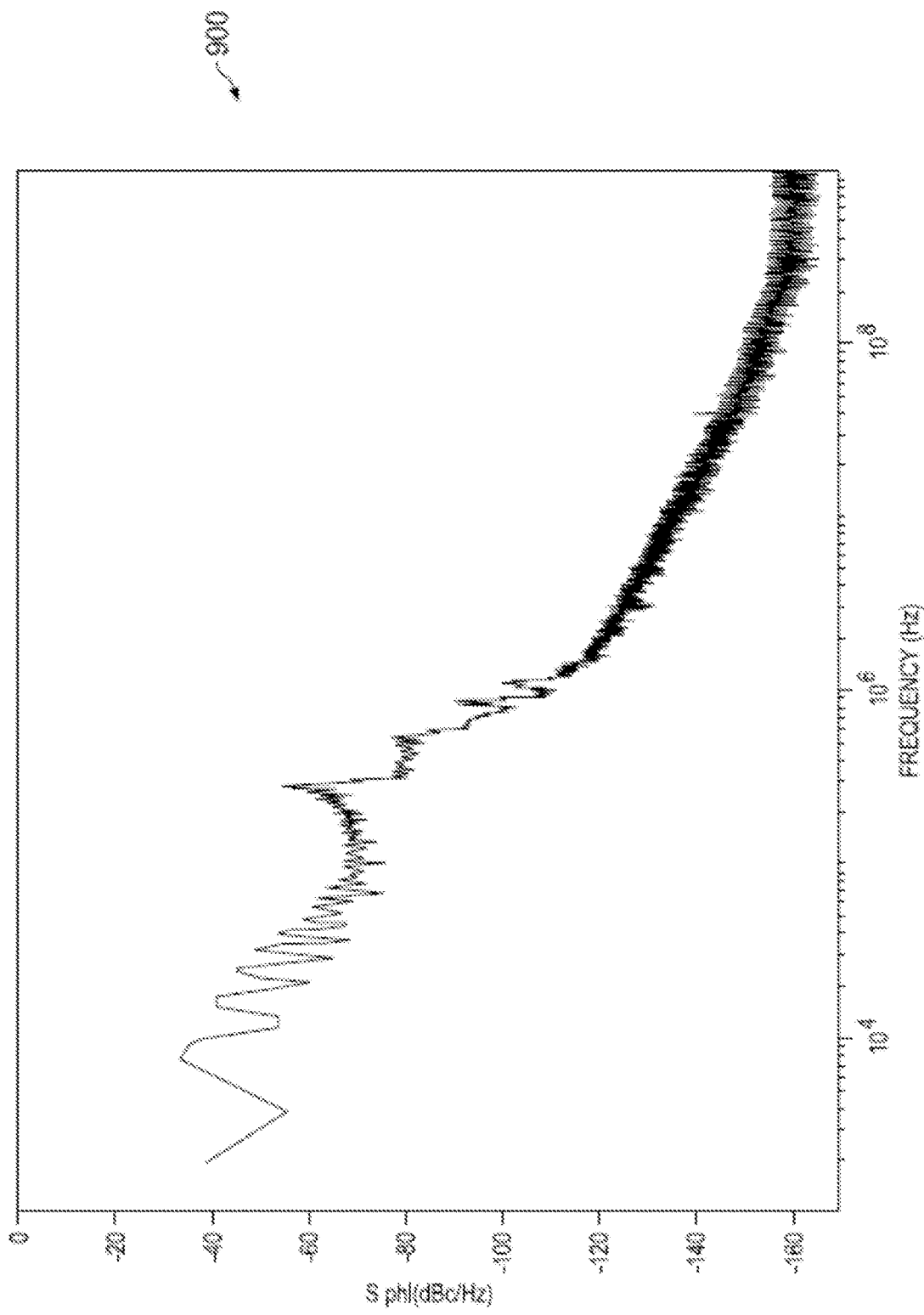
FIG. 9 is a graph illustrating noise in a fractional-N ADPLL without dithering by a delay line.

FIG. 9 is a graph 900 illustrating noise in a fractional-N ADPLL without dithering by a delay line. The graph 900 depicts the output noise spectrum of an example fractional-N ADPLL with a ratio of output to input frequency of 66.0001 without dither enabled. The spectrum contains large spurs, for example, at 10 kilohertz, which limit the usage of the fractional-N ADPLL.

Figure 10:
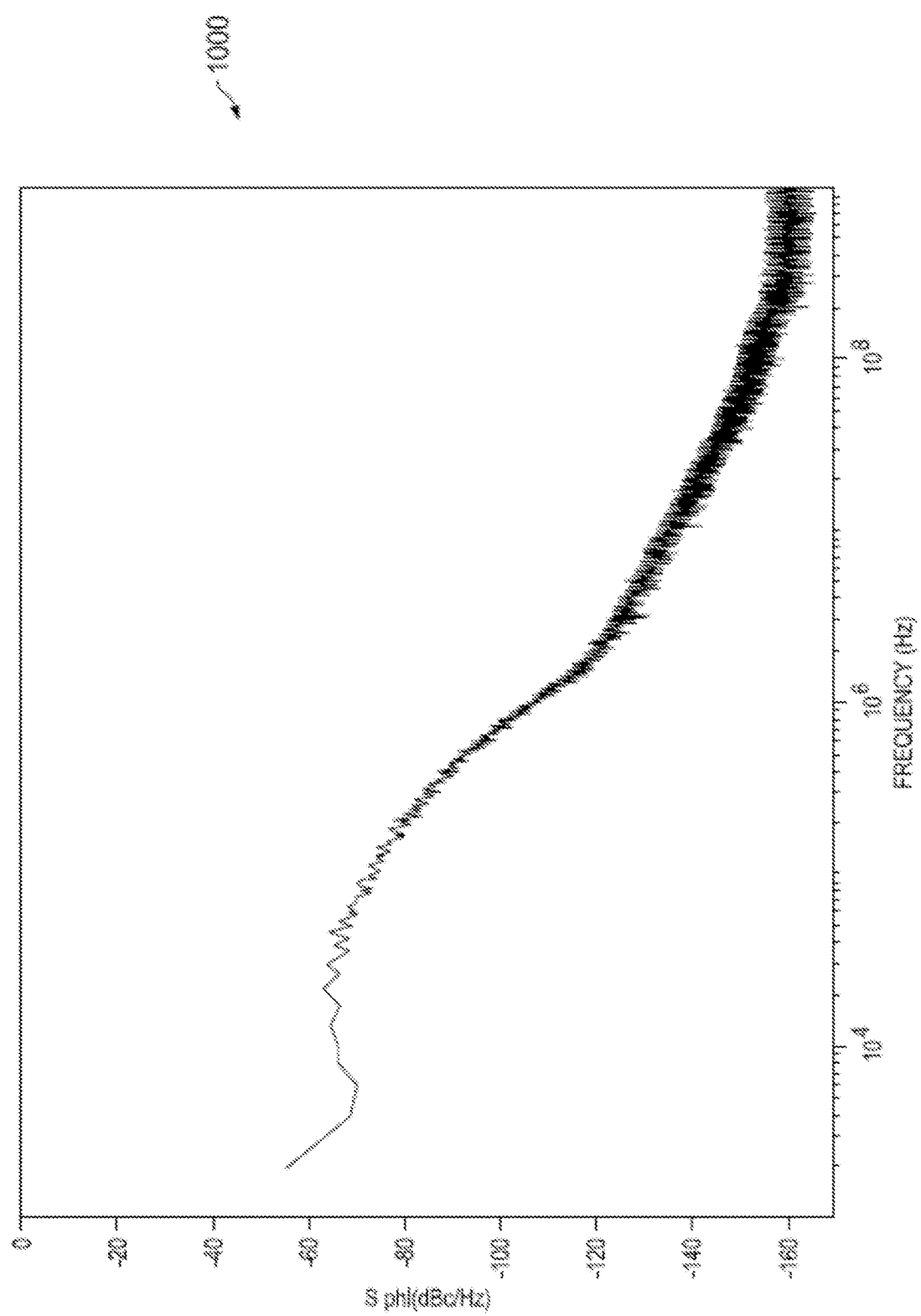
FIG. 10 is a graph illustrating noise reduction in a fractional-N ADPLL having a frequency reference dithered by a delay line in accordance with some embodiments.

FIG. 10 is a graph 1000 illustrating noise reduction in a fractional-N ADPLL having a frequency reference dithered by a delay line in accordance with some embodiments. The graph 900 depicts the output noise spectrum of an example fractional-N ADPLL with a ratio of output to input frequency of 66.0001 with dither enabled. The spectrum is free of any visible spurs.

Figure 11:
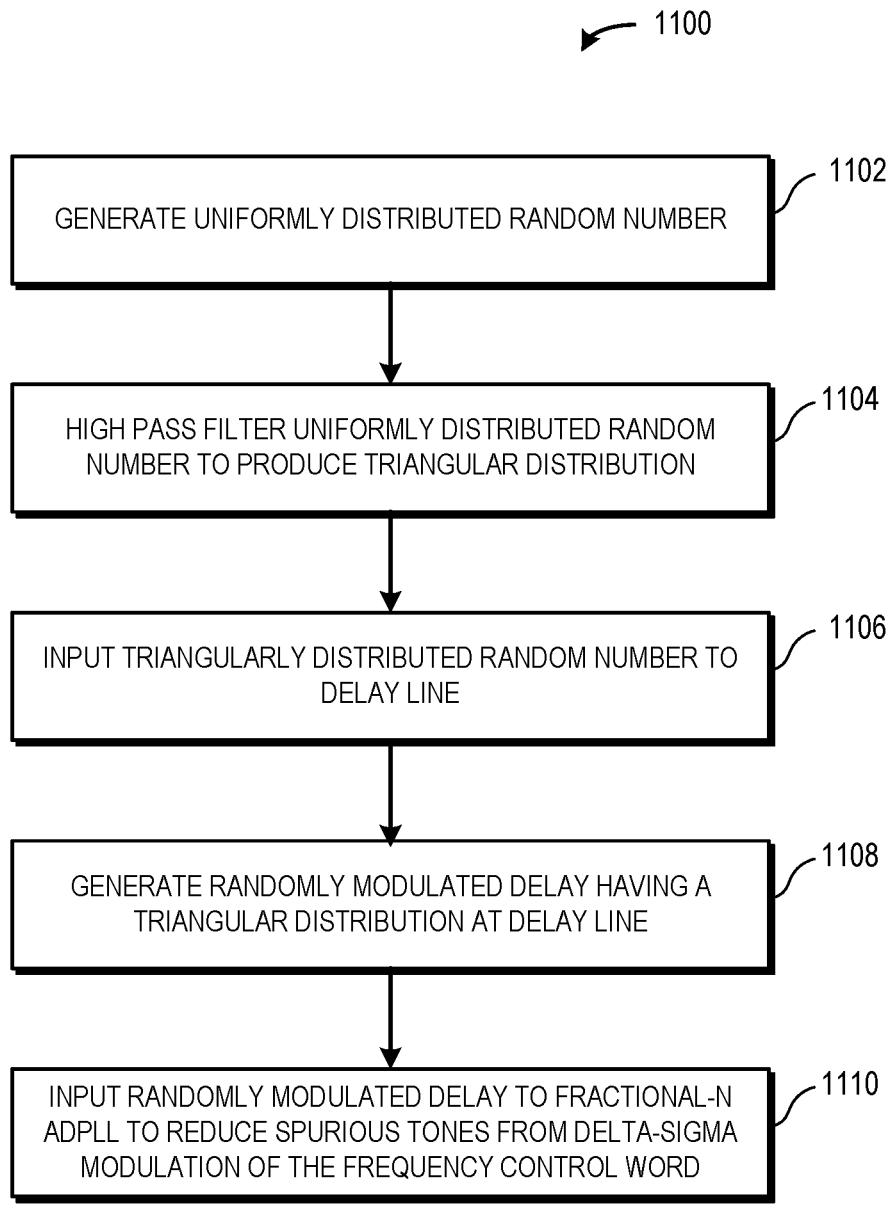
FIG. 11 is a flow diagram of a method of dithering a phase of a reference clock signal at an input of a fractional-n ADPLL with a dithering signal having a triangular distribution in accordance with some embodiments.

FIG. 11 is a flow diagram of a method 1100 of dithering a phase of a reference clock signal at an input of a fractional-n ADPLL with a dithering signal having a triangular distribution in accordance with some embodiments. The method 1100 is described with respect to an example implementation of the system 100 of FIG. 1. The system 100 includes the fractional-N ADPLL 150 in which the frequency control word is modulated by the delta-sigma modulator 104, which introduces spurious tones due to regular quantization patterns in the feedback path. At block 1102, the random number source 126 generates a uniformly distributed random number 138 having a flat spectrum. In some embodiments, the random number source 126 is implemented as the LFSR 704.

At block 1104, the high pass filter 124 high-pass filters the uniformly distributed random number 138 to produce a random number having a triangular distribution to use as the delay control 142 input to the variable delay line 122. In some embodiments, the high pass filter 124 is a first order high pass filter that differentiates the uniformly distributed random number 138 such that the probability distribution of the differences between the normalized values of the uniformly distributed random number follows a triangular distribution. At block 1106, the triangularly distributed random number is input to the variable delay line 122.

At block 1108, the variable delay line 122 generates a randomly modulated delay 140 having a triangular distribution. In some embodiments, the variable delay line 122 is controlled by a digital signal and is implemented in either the analog domain or the digital domain. In some embodiments in which the variable delay line 122 is implemented in the analog domain, the variable delay line 122 includes a plurality of unit delay cells 502, 504 and varies either the delay of each unit delay cell 502, 504 or the number of unit delay cells 502, 504 that the signal that is to be delayed traverses. In some embodiments in which the variable delay line 122 is implemented in the digital domain, a dynamic element matching module 702 is included to randomize mismatch to eliminate spurs from the variable delay line 122. Further, in some embodiments the variable delay line 122 is implemented as a single delay line, while in other embodiments the variable delay line 122 is split into a coarse resolution variable delay line 818 and a fine resolution variable delay line 808.

At block 1110, the randomly modulated delay 140 is input to the fractional-N ADPLL 150 to reduce spurious tones resulting from delta-sigma modulation of the frequency control word 132. In some embodiments, additional control signals can be added to control the amount of dither to support dithering for multiple TDC resolutions.

In some embodiments, certain aspects of the techniques described above may implemented by one or more processors of a processing system executing software. The software comprises one or more sets of executable instructions stored or otherwise tangibly embodied on a non-transitory computer readable storage medium. The software can include the instructions and certain data that, when executed by the one or more processors, manipulate the one or more processors to perform one or more aspects of the techniques described above. The non-transitory computer readable storage medium can include, for example, a magnetic or optical disk storage device, solid state storage devices such as Flash memory, a cache, random access memory (RAM) or other non-volatile memory device or devices, and the like. The executable instructions stored on the non-transitory computer readable storage medium may be in source code, assembly language code, object code, or other instruction format that is interpreted or otherwise executable by one or more processors.

A computer readable storage medium may include any storage medium, or combination of storage media, accessible by a computer system during use to provide instructions and/or data to the computer system. Such storage media can include, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A method comprising:
   dithering a frequency control word of an integer all-digital phase locked loop (ADPLL) with a delta-sigma modulator to generate a fractional-n ADPLL; and
   adding a randomly modulated delay having a triangular distribution to a frequency reference at an input of the fractional-n ADPLL.

2. The method of claim 1, wherein a range of the randomly modulated delay spans at least q to −q, wherein q is a quantization step of a time-to-digital converter of the ADPLL.

3. The method of claim 2, further comprising:
   generating the randomly modulated delay based on a uniformly distributed random number with a flat spectrum shaped by a high pass filter.

4. The method of claim 3, wherein the random number has the triangular distribution spanning at least q to −q after shaping by the high pass filter.

5. The method of claim 1, wherein adding the randomly modulated delay comprises:
   receiving the frequency reference at a delay line comprising a plurality of delay cells; and
   varying at least one of:
      a delay of each delay cell; and
      a number of delay cells that the frequency reference traverses.

6. The method of claim 5, wherein the delay line comprises a fine delay line and a coarse delay line.

7. The method of claim 6, further comprising:
   controlling the fine delay line independently from controlling the coarse delay line.

8. An all-digital phase locked loop (ADPLL) comprising:
   a delta-sigma modulator configured to dither a frequency control word of the ADPLL; and
   a delay line configured to add a randomly modulated delay having a triangular distribution to a frequency reference at an input of the ADPLL.

9. The ADPLL of claim 8, further comprising:
   a time-to-digital converter, wherein a range of the randomly modulated delay spans at least spans at least q to −q, wherein q is a quantization step of the time-to-digital converter.

10. The ADPLL of claim 9, further comprising:
    a high pass filter configured to shape uniformly distributed random numbers with a flat spectrum into the triangular distribution to generate the randomly modulated delay.

11. The ADPLL of claim 10, wherein the triangular distribution spans at least q to −q after shaping by the high pass filter.

12. The ADPLL of claim 8, wherein the delay line comprises a plurality of delay cells and is configured to receive the frequency reference and vary at least one of:
    a delay of each delay cell; and
    a number of delay cells that the frequency reference traverses.

13. The ADPLL of claim 12, wherein the delay line comprises a fine delay line and a coarse delay line.

14. The ADPLL of claim 13, wherein the fine delay line is controlled independently from the coarse delay line.

15. A fractional-n all-digital phase locked loop (ADPLL) comprising:
    a delay line configured to dither a phase of a frequency reference at an input of the fractional-n ADPLL with a randomly modulated delay having a triangular distribution; and
    a high pass filter that is coupled to the delay line and that is configured to receive uniformly distributed random numbers with a flat spectrum and to shape the uniformly distributed random numbers into the triangular distribution to generate the randomly modulated delay.

16. The fractional-n ADPLL of claim 15, further comprising:
    a time-to-digital converter configured to receive the randomly modulated delay from the delay line, wherein a range of the randomly modulated delay spans at least q to −q, wherein q is a quantization step of the time-to-digital converter.

17. The fractional-n ADPLL of claim 16, further comprising:
    a random number source configured to generate the uniformly distributed random numbers and to output the uniformly distributed random numbers to the high pass filter.

18. The fractional-n ADPLL of claim 16, wherein the triangular distribution spans at least q to −q after shaping of the triangular distribution by the high pass filter.

19. The fractional-n ADPLL of claim 15, wherein the delay line comprises a plurality of delay cells and is configured to receive and vary at least one of a delay of each delay cell and a number of delay cells that the frequency reference traverses.

20. The fractional-n ADPLL of claim 19, wherein the delay line comprises a fine delay line and a coarse delay line.

* * * * *